United States Patent
Ushiyama

(10) Patent No.: US 8,468,485 B2
(45) Date of Patent: Jun. 18, 2013

(54) INTEGRATED CIRCUIT, INTEGRATED CIRCUIT DESIGN DEVICE AND INTEGRATED CIRCUIT DESIGN METHOD

(75) Inventor: Kenichi Ushiyama, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 173 days.

(21) Appl. No.: 13/051,619

(22) Filed: Mar. 18, 2011

(65) Prior Publication Data

US 2011/0298532 A1 Dec. 8, 2011

(30) Foreign Application Priority Data

Jun. 8, 2010 (JP) ................................. 2010-131271

(51) Int. Cl.
*H01L 25/00* (2006.01)
*G06F 17/50* (2006.01)

(52) U.S. Cl.
USPC ........... 716/120; 716/118; 716/119; 716/132; 716/133; 716/135; 327/564

(58) Field of Classification Search
USPC ................. 716/118, 119, 120, 132, 133, 135, 716/564; 327/564
See application file for complete search history.

(56) References Cited

U.S. PATENT DOCUMENTS

| | | | | |
|---|---|---|---|---|
| 6,208,170 B1* | 3/2001 | Iwaki et al. | | 326/121 |
| 6,483,374 B1* | 11/2002 | Mizuno et al. | | 327/534 |
| 7,131,081 B2* | 10/2006 | Wang et al. | | 716/136 |
| 7,610,533 B2* | 10/2009 | Ishimura et al. | | 714/726 |
| 7,768,768 B2* | 8/2010 | Sakurabayashi | | 361/306.1 |
| 2006/0174176 A1 | 8/2006 | Ishimura et al. | | |
| 2009/0164860 A1 | 6/2009 | Ishimura et al. | | |

FOREIGN PATENT DOCUMENTS

JP 2005-157487 A 6/2005
JP 2006-210841 A 8/2006

* cited by examiner

*Primary Examiner* — Sun Lin
(74) *Attorney, Agent, or Firm* — Arent Fox LLP

(57) ABSTRACT

The disclosed integrated circuit includes a first and a second power supply wirings, a flip-flop circuit, and a switch element. The first and the second power supply wirings are connected to the common power supplies. The flip-flop circuit is required to hold the stored data even when the voltage supply from the power supplies to the integrated circuit is stopped. The flip-flop circuit is connected to the first power supply wiring. The switch element is a transistor, for example, and switches whether or not the voltage is supplied from the power supplies. The switch element is provided on the second power supply wiring.

3 Claims, 9 Drawing Sheets

-- RELATED ART --

INTEGRATED CIRCUIT, INTEGRATED CIRCUIT DESIGN DEVICE AND INTEGRATED CIRCUIT DESIGN METHOD

CROSS-REFERENCE TO RELATED APPLICATION

This application is based upon and claims the benefit of priority of the prior Japanese Patent Application No. 2010-131271, filed on Jun. 8, 2010, the entire contents of which are incorporated herein by reference.

FIELD

This invention relates to an integrated circuit in which flip-flop circuits are arranged.

BACKGROUND

Recently, there appears an integrated circuit (LSI) loading plural cells on a single chip. In the integrated circuit of this kind, there is such a problem that the electric power consumption increases due to the increase of the circuit scale. Therefore, it is considered to decrease the voltage supplied to the integrated circuits which are not used, thereby achieving conservation of electric power.

When the voltage supplied to the integrated circuit is decreased, there is a case that the flip-flop circuits arranged in the integrated circuit are required to hold the data stored inside. Therefore, it is conceived that the power supplies are separately provided for the flip-flop circuits required to hold the data and the cells other than those flip-flop circuits (See. Japanese Laid-open Patent Applications No. 2006-210841 and No. 2005-157487).

However, when the power supplies are separately provided as described above, the number of the power supplies increases, and there is an anxiety that the chip size increases.

SUMMARY

The disclosed integrated circuit includes a first and a second power supply wirings connected to common power supplies; a flip-flop circuit connected to the first power supply wiring; and a switch element which is provided on the second power supply wiring and which switches whether or not to supply voltage from the power supplies.

The disclosed integrated circuit includes a first and a second power supply wirings, a flip-flop circuit, and a switch element. The first and the second power supply wirings are connected to the common power supplies. The flip-flop circuit is required to hold the stored data even when the voltage supply from the power supplies to the integrated circuit is stopped. The flip-flop circuit is connected to the first power supply wiring. The switch element is a transistor, for example, and switches whether or not the voltage is supplied from the power supplies. The switch element is provided on the second power supply wiring.

According to the disclosed integrated circuit, since the power supplies which supply the voltage to the first and the second power supply wirings are provided in common, the number of the power supplies can be reduced and the increase of the chip size can be suppressed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An example of an embodiment will be described below with reference to the attached drawings.

[Hardware Configuration]

First, the description will be given of an example of a hardware configuration of an integrated circuit design device 200 according to the embodiment.

Figure 1:
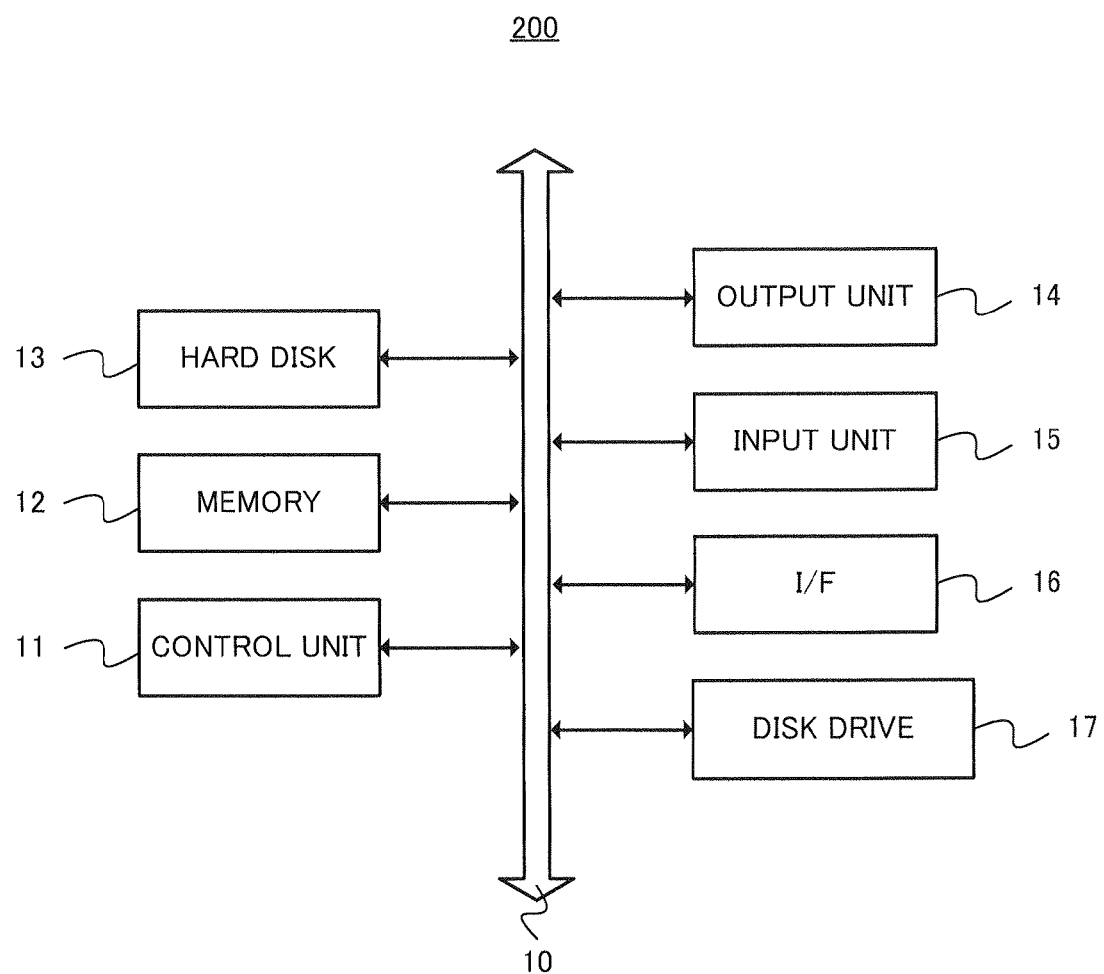
FIG. 1 is a diagram showing an example of a hardware configuration of an integrated circuit design device according to an embodiment.

FIG. 1 shows an example of a hardware configuration of the integrated circuit design device 200. The integrated circuit design device 200 is a computer such as a PC (Personal Computer), for example, and includes a control unit 11, a memory 12, a hard disk 13, an output unit 14, an input unit 15, an interface (I/F) 16 and a disk drive 17. These constitutional elements are connected to a bus 10. The control unit 11 is a CPU (Central Processing Unit), for example. The memory 12 is a ROM (Read Only Memory) or a RAM (Random Access Memory), for example. The output unit 14 is an output device such as a monitor and a printer, and the input unit 15 is an input device such as a mouse and/or a keyboard. The interface 16 is an external connection interface such as a USB (Universal Serial Bus). The disk drive 17 is a disk drive for driving a disk such as a DVD (Digital Versatile Disc).

In the integrated circuit design device 200, the control unit 11 executes a program based on the instruction from the user. Thus, the integrated circuit according to the embodiment is designed based on the data inputted by the user. The integrated circuit according to the embodiment will be described below.

[Integrated Circuit]

First, prior to explaining the integrated circuit according to the embodiment, an integrated circuit according to a comparative example will be described with reference to FIGS. 2 and 3. The integrated circuit described below is designed such that, even when the voltage supply from the power supply is stopped, the voltage is supplied to the flop-flop circuit which is required to hold the data.

Figure 2:
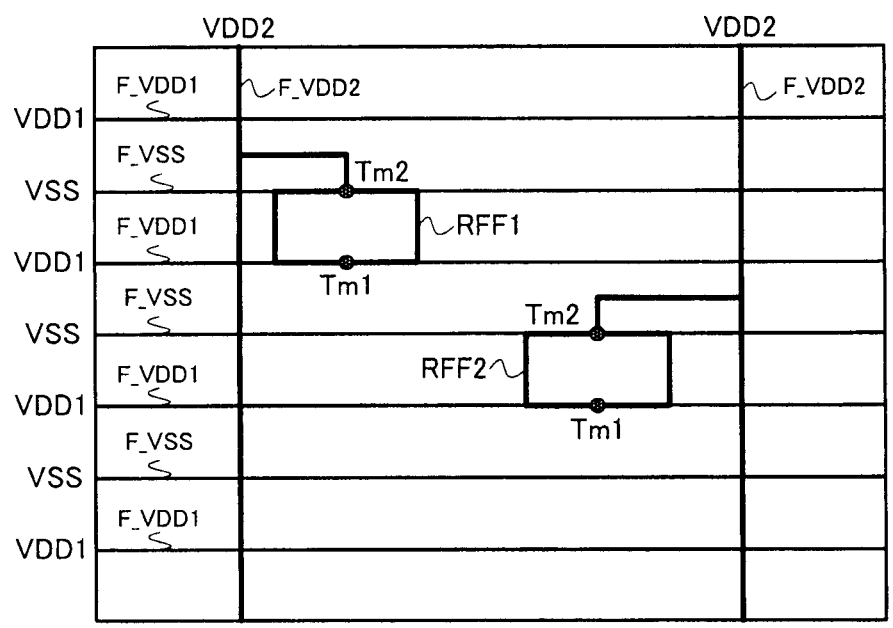
FIG. 2 is a diagram showing an example of a configuration of an integrated circuit according to a comparative example.

FIG. 2 is an example of a layout block diagram of an integrated circuit 100R using a flip-flop circuit having two power supply terminals including a power supply terminal for data holding and a power supply terminal for normal operation (hereinafter referred to as "two power supply flip-flop circuit") The power supply terminal for normal operation is a terminal for supplying voltage to all elements in the two power supply flip-flop circuit. The power supply terminal for data holding is a terminal for supplying voltage only to the elements associated with the data holding in the two power supply flip-flop circuit.

In the integrated circuit 100R shown in FIG. 2, the flip-flop circuits RFF1, RFF2 are the two power supply flip-flop circuits. The power supply wiring F_VDD1 is a wiring connected to the power supply terminal Tm1 for normal operation in the two power supply flip-flop circuit and the power supply terminal of the cells (not shown) other than the two power supply flip-flop circuit. Both ends of the power supply wiring F_VDD1 are connected to the power supply VDD1. The power supply wiring F_VDD2 is a wiring to which the power supply terminal Tm2 for data holding of the two power supply flip-flop circuit is connected. Both ends of the power supply wiring F_VDD2 are connected to the power supply VDD2. The power supply wiring F_VSS is a wiring connected to the ground terminal of all cells. Both ends of the power supply wiring F_VSS are connected to the power supply VSS set to ground (0V), for example.

As shown in FIG. 2, in the integrated circuit 100R, in order to supply the voltage to the power supply terminal Tm2 for data holding, the wiring is drawn out from the power supply wiring F_VDD2 to the power supply terminal Tm2, Therefore, in the integrated circuit 100R, there is an anxiety that the efficiency of wiring is deteriorated and the chip size is increased.

Figure 3:
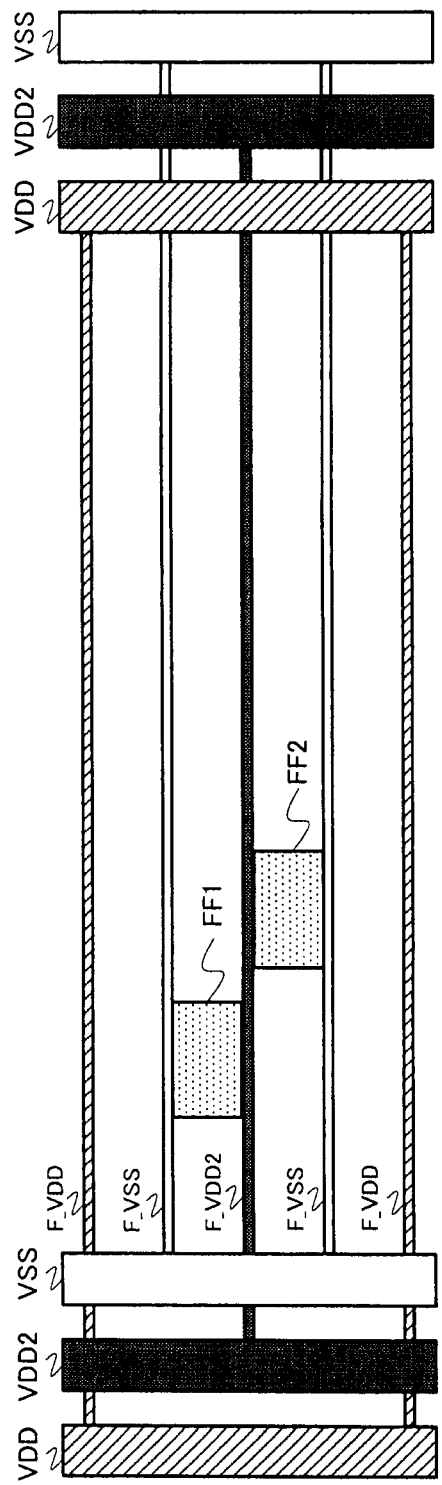
FIG. 3 is a diagram showing an example of a configuration of the integrated circuit according to the comparative example.

FIG. 3 is an example of a layout block diagram of an integrated circuit 100L in which the power supplies for supplying voltage are separately provided for the flip-flop circuits required to hold the data and the cells other than those flip-flop circuits.

In FIG. 3, the flip-flop circuits FF1, FF2 are the flip-flop circuits which are required to hold the data stored inside. Different from the flip-flop circuits shown in FIG. 2, the flip-flop circuits FF1, FF2 are not provided with the power supply terminals for holding data.

The power supplies VDD2 are dedicated power supplies to supply the voltage to the flip-flop circuits FF1, FF2. The power supplies VDD2 are arranged in parallel with each other, and plural power supply wirings F_VDD2 are arranged to connect the power supplies VDD2. To the power supply wirings F_VDD2, the power supply terminals (i.e., the power supply terminals for normal operation) of the flip-flop circuits FF1, FF2 are connected. The power supplies VDD are the power supplies which supply the voltage to the cells (not shown) other than the flip-flop circuits FF1, FF2. The power supplies VDD are arranged in parallel with each other, and plural power supply wirings F_VDD are arranged to connect the power supplies VDD. To the power supply wirings F_VDD, the power supply terminals of the cells other than the flip-flop circuits FF1, FF2 are connected. To the power supplies VDD, the power supply wirings F_VSS are connected. The power supplies VSS are arranged in parallel with each other, and plural power supply wirings F_VSS are arranged to connect the power supplies VSS. To the power supply wirings F_VSS, the ground terminal of all cells are connected. The power supply wirings F_VDD and the power supply wirings F_VSS are alternately arranged.

The control circuit for controlling the integrated circuit 100L holds the voltage of the power supplies VDD2 and decreases the voltage of the power supplies VDD when the voltage supplied to the integrated circuit 100L is decreased. By this, the voltage supplied to the cells other than the flip-flop circuits FF1, FF2 can be decreased, while holding the voltage supplied to the flip-flop circuits FF1, FF2. Thus, even when the voltage supplied to the integrated circuit 100L is decreased, the data stored in the flip-flop circuits FF1, FF2 can be held. However, since the power supplies VDD2 for data holding are provided in addition to the power supplies VDD in the integrated circuit 100L, there is an anxiety that the chip size increases.

In this view, in the integrated circuit according to the embodiment, the power supplies for supplying the voltage are provided in common, for the flip-flop circuits required to hold the data and the other cells, and the power supply wirings to supply the voltage to the other cells are provided with switch elements. The description will be specifically given below with reference to FIG. 4.

Figure 4:
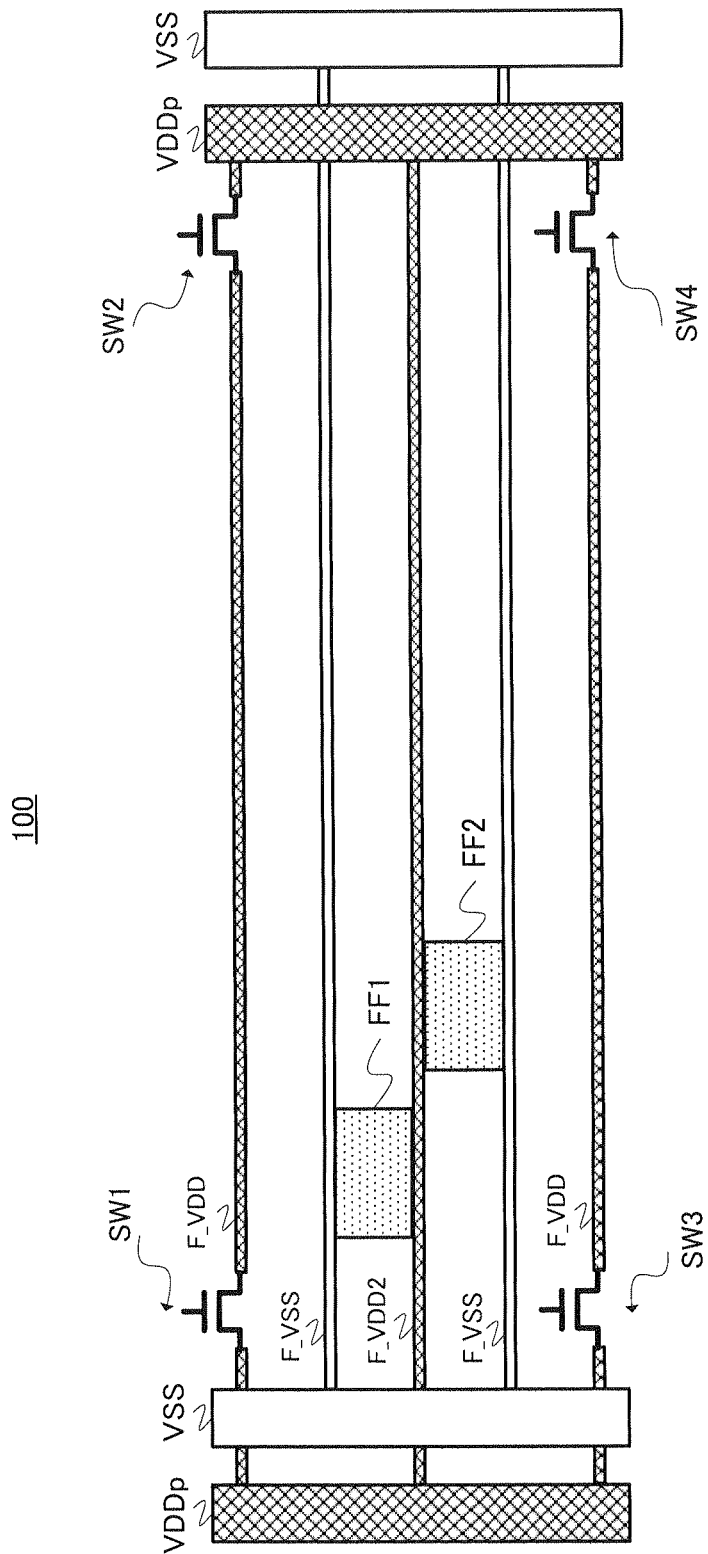
FIG. 4 is a diagram showing an example of a configuration of an integrated circuit according to the embodiment.

FIG. 4 shows an example of a layout block diagram of an integrated circuit 100 according to the embodiment. In FIG. 4, the constitutional elements identical to those shown in FIG. 3 are indicated by the identical reference signs.

As shown in FIG. 4, in the integrated circuit 100, two power supply wirings F_VDD and one power supply wiring F_VDD2 are connected to the common power supplies VDDp. Specifically, the power supplies VDDp are provided in parallel with each other, and the power supply wirings F_VDD, F_VDD2 are arranged to connect the power supplies VDDp. In addition, the power supplies VSS are arranged in parallel with each other, and the power supply wirings F_VSS are arranged to connect the power supplies VSS. The power supply wirings F_VDD, F_VDD2 and the power supply wirings F_VDD are alternately arranged.

The flip-flop circuits FF1, FF2 required to hold the data are arranged along the power supply wirings F_VDD2. The cells (not shown) other than the flip-flop circuits FF1, FF2 are arranged along the power supply wirings F_VDD. Further, the switch elements SW1 to SW4 such as transistors are provided to the power supply wirings F_VDD. These switch elements are provided to switch the supply of voltage from the power supplies VDDp to the power supply wirings F_VDD. Specifically, the switch elements are provided at both ends of the power supply wirings F_VDD in order to control the supply of the voltage from each of the two power supplies VDDp connected to both ends of the power supply wirings F_VDD. In the example shown in FIG. 4, out of the two power supply wirings F_VDD, one power supply wiring F_VDD is provided with the switch elements Sw1, Sw2 at both ends, and the other power supply wiring F_VDD is provided with the switch elements Sw3, SW4 at both ends. As is understood from this, the power supply wiring F_VDD2 functions as the first power supply wiring, and the power supply wiring F_VDD functions as the second power supply wiring.

When the voltage supplied to the integrated circuit 100 is decreased, the control circuit controlling the integrated circuit 100 switches the switch elements SW1 to Sw4 and stops the supply of the voltage from the power supplies VDDp to the power supply wiring F_VDD. At that time, the voltage from the power supplies VDDp is still supplied to the power supply wiring F_VDD2. In this way, similarly to the description of FIG. 3, the power supply voltages supplied to the cells other than the flip-flop circuits FF1, FF2 can be decreased, while holding the voltage supplied to the flip-flop circuits FF1, FF2. In comparison with the integrated circuit 100L shown in FIG. 3, in the integrated circuit 100 according to the embodiment, the power supplies for supplying the voltage are provided in common for the flip-flop circuits and the cells other than the flip-flop circuits. Therefore, in comparison with the integrated circuit 100L, the integrated circuit 100 according to the embodiment can reduce the number of the power supplies and can suppress the increase of the chip size.

Next, integrated circuits of other examples according to the embodiment will be described with reference to FIGS. 5 and 6.

Figure 5:
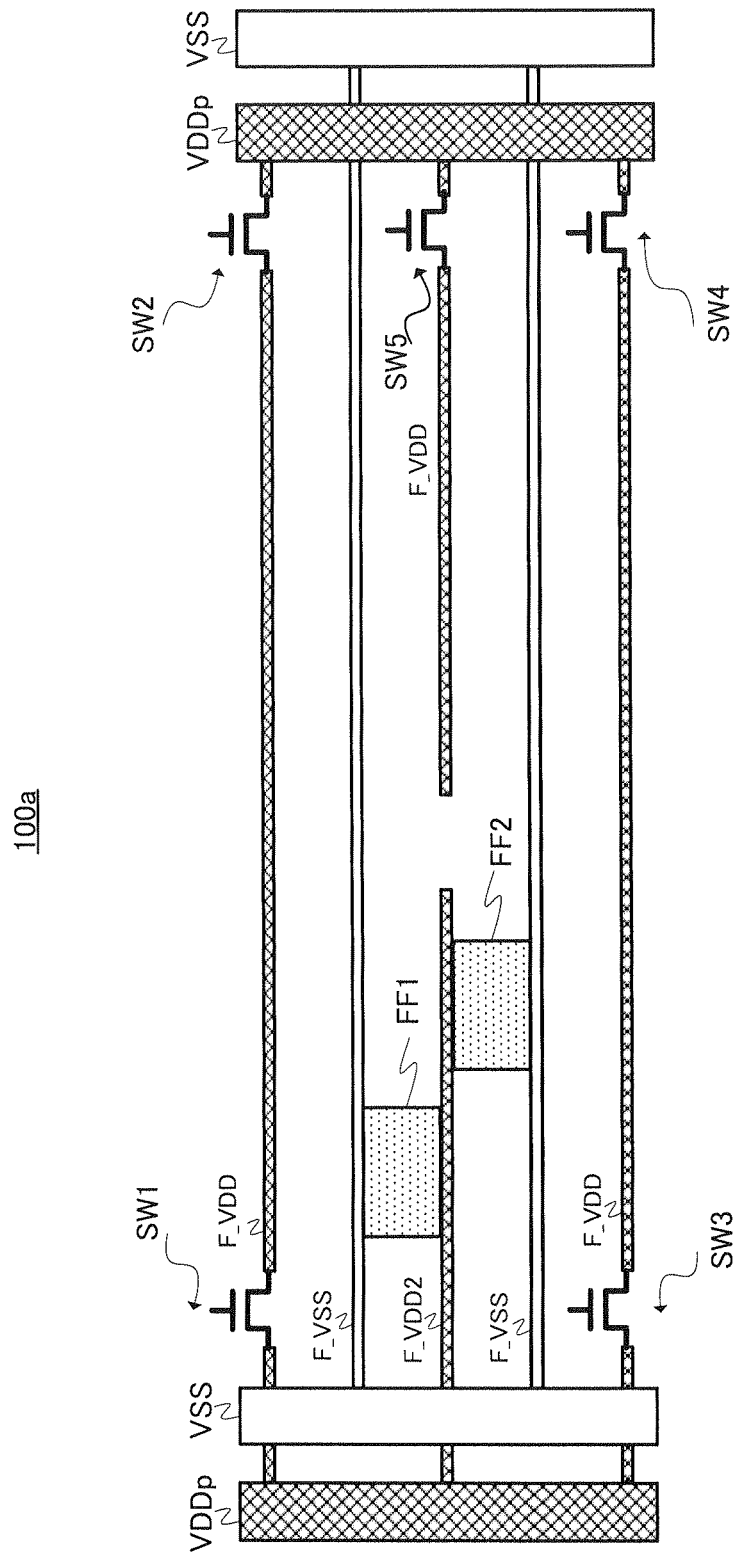
FIG. 5 is a diagram showing an example of a configuration of another integrated circuit according to the embodiment.

FIG. 5 shows an example of a layout block diagram of an integrated circuit 100a according to another example of the embodiment. In FIG. 5, the constitutional elements identical to those shown in FIG. 4 are indicated by the identical reference signs.

In the integrated circuit 100 shown in FIG. 4, the plural power supply wirings are arranged to connect the power supplies VDDp. In contrast, in the integrated circuit according to another example of the embodiment, at least one power supply wiring out of the plural power supply wirings connecting the power supplies VDDp is cut, and one wiring of the power supply wiring thus cut is used as the power supply wiring F_VDD2 while the other wiring is used as the power supply wiring F_VDD. Namely, the integrated circuit according to another example of the embodiment includes the power supply wiring F_VDD2 having one end connected to the power supply VDDp and the other end cut, and the power supply wiring F_VDD having one end connected to the power supply VDDp and the other end cut. For example, in the integrated circuit 100a shown in FIG. 5, out of the plural power supply wirings connecting the power supplies VDDp, one power supply wiring is cut, and one wiring of the power supply wiring thus cut is used as the power supply wiring F_VDD2 while the other wiring thereof is used as the power supply wiring F_VDD. To the power supply wiring F_VDD2, the flip-flop circuits FF1, FF2 are connected. At one end of the power supply wiring F_VDD, the switch element SW5 is provided.

When the voltage supplied to the integrated circuit 100a is decreased, the control circuit controlling the integrated circuit 100a switches the switch elements SW1 to SW5 to stop the supply of the voltage from the power supplies VDDp to the power supply wirings F_VDD. In this way, similarly to the case of FIG. 4, the power supply voltage supplied to the cells other than the flip-flop circuits FF1, FF2 can be decreased, while holding the voltage supplied to the flip-flop circuits FF1, FF2. In the following description, the flip-flop circuits required to hold the data are referred to as "flip-flop circuit FF", and the switch elements are referred to as "switch elements SW".

Figure 6:
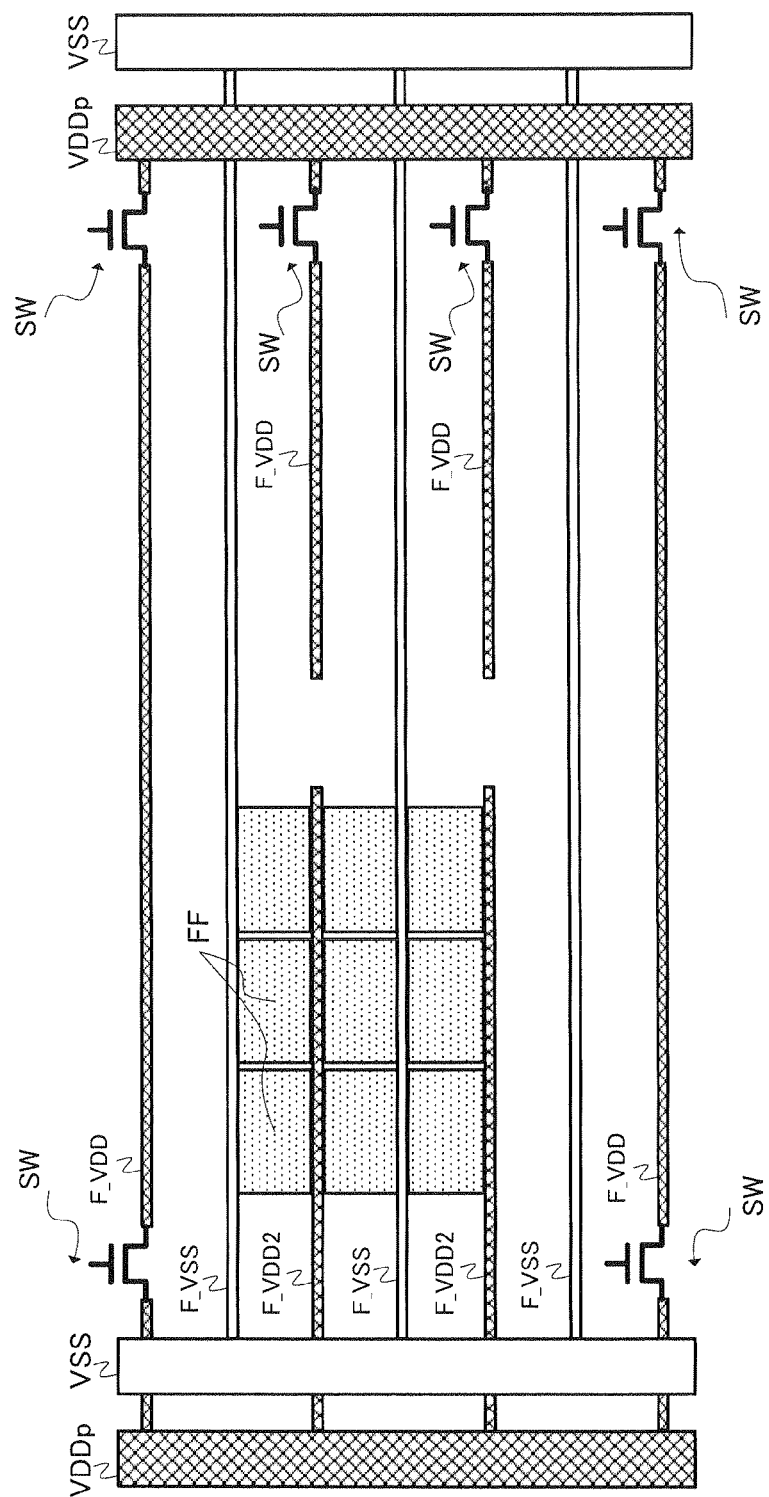
FIG. 6 is a diagram showing an example of a configuration of another integrated circuit according to the embodiment.

FIG. 6 shows an example of a layout block diagram of an integrated circuit 100b according to another example.

As shown in FIG. 6, in the integrated circuit 100b, two power supply wirings out of the plural power supply wirings connecting the power supplies VDDp are cut, and one wiring of each of the power supply wirings thus cut is used as the power supply wirings F_VDD2 while other wiring of each of the power supply wirings thus cut are used as the power supply wirings F_VDD. To the power supply wirings F_VDD2, the plural flip-flop circuits FF are connected. In addition, the switch elements SW are provided on the power supply wirings F_VDD.

As is understood from the above description, also in the integrated circuits 100a, 100b shown in FIGS. 5 and 6, the power supplies for supplying the voltage is provided in common for the flip-flop circuits and the cells other than the flip-flop circuits. Therefore, by the integrated circuits 100a, 100b shown in FIGS. 5 and 6, similarly to the integrated circuit 100 according to the embodiment, the number of the power supplies can be reduced, and the increase of the chip size can be suppressed. In addition, the integrated circuits 100a, 100b includes the power supply wiring F_VDD2 having one end connected to the power supply VDDp and the other end cut, and the power supply wiring F_VDD having one end connected to the power supply VDDp and the other end cut, and the power supply wiring F_VDD is provided with the switch element. With this configuration, as shown in FIG. 6, the flip-flop circuits can be arranged in a manner concentrated on one side of the two sides where the power supplies are arranged in the integrated circuit.

[Integrated Circuit Design Method]

Figure 7:
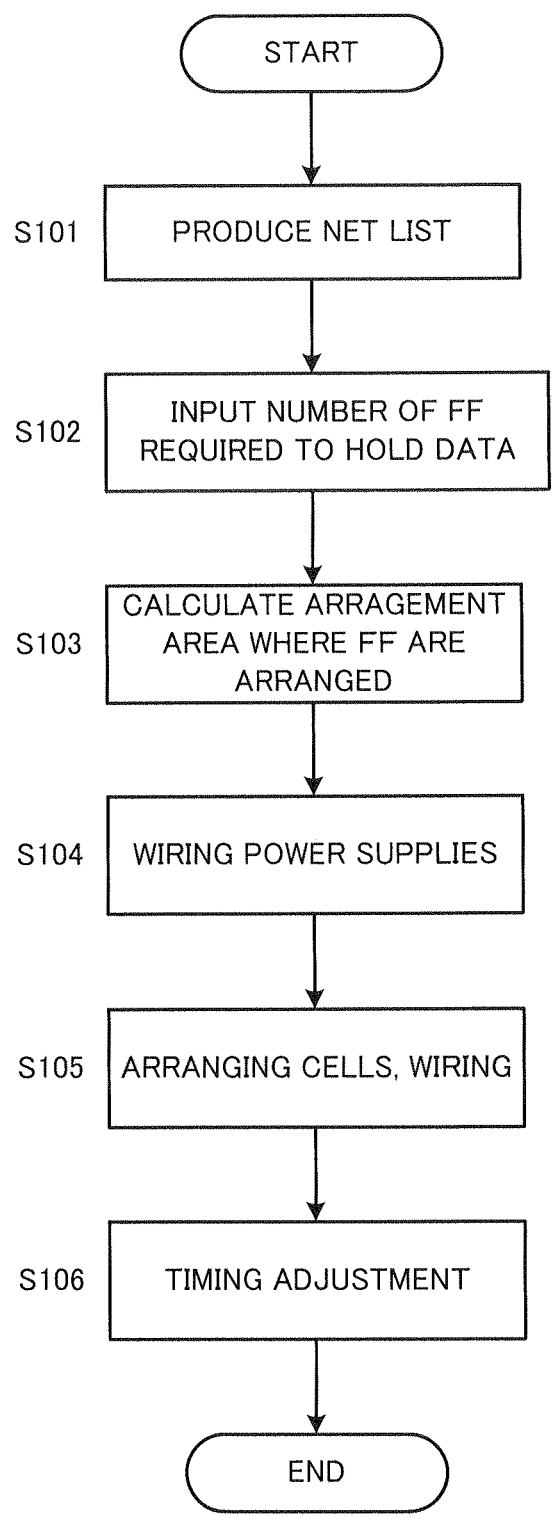
FIG. 7 is a flowchart showing an example of an integrated circuit design method according to the embodiment.

Next, the integrated circuit design method executed by the integrated circuit design device 200 will be described with reference to the flowchart of FIG. 7. FIG. 7 is the flowchart showing the design process of designing the integrated circuit according to the embodiment. The design process shown in FIG. 7 is achieved by the control unit 11 executing the program in the integrated circuit design device 200.

First, in step S101, the control unit 11 produces a net list based on the circuit diagram inputted by the user. In next step S102, the number of the flip-flop circuits FF arranged to be on the substrate of the integrated circuit is inputted by the user.

In step S103, the control unit 11 calculates the arrangement area where the flip-flop circuits FF are arranged, based on the number of the flip-flop circuits FF and the size of the flip-flop circuits FF. This calculation method will be specifically described with reference to FIG. 8.

Figure 8:
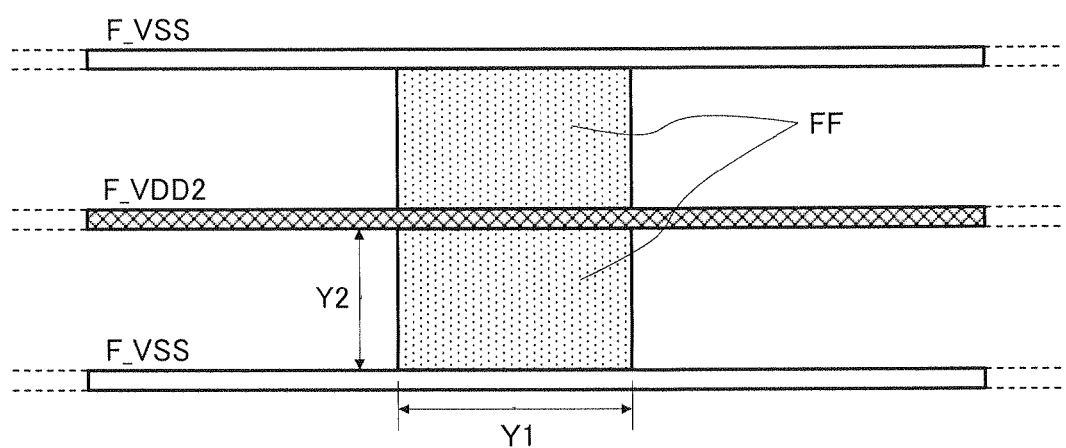
FIG. 8 is an enlarged view of the integrated circuit according to the embodiment.

FIG. 8 is an enlarged view of the flip-flop circuit FF arranged along the power supply wiring F_VDD2. In FIG. 8, the length of the flip-flop circuit FF along the power supply wiring F_VDD2 is expressed by Y1, and the length thereof in the direction orthogonal to the power supply wiring F_VDD2 is expressed by Y2.

The control unit 11 calculates the total length L of the power supply wirings F_VDD2 required in the integrated circuit, based on the number N of the flip-flop circuits FF. The total length L of the power supply wirings F_VDD2 can be calculated by the following equation (1). Here, the reason why diving by 2 is that two flip-flop circuits FF can be arranged symmetrically with respect to one power supply wiring F_VDD2 as shown in FIG. 8.

$$L=(N \times Y1)/2 \qquad (1)$$

When the control unit 11 calculates the total length L of the power supply wirings F_VDD2 by the equation (1), the control unit 11 then calculates the width of the area where the flip-flop circuits FF are arranged, based on the length pL per one power supply wiring F_VDD2. As is previously shown, compared with the length per one power supply wiring F_VDD2 shown in FIG. 3, the length per one power supply wiring F_VDD2 shown in FIG. 4 is short. The control unit 11 can calculate the necessary number of the power supply wirings F_VDD2 having the length pL, by dividing the length L obtained by using the equation (1) by the length pL. The necessary number of the power supply wirings F_VDD2 thus obtained and the length pL of the power supply wiring F_VDD2 show the arrangement area where the flip-flop circuits FF are arranged.

In this way, the control unit 11 calculates the arrangement area of the flip-flop circuits FF based on the length pL of the flip-flop circuits FF and the number of the flip-flop circuits FF.

Returning to the flowchart of FIG. 7, in step S104, the control unit 11 performs the design of the power supply wirings of the flip-flop circuits FF, specifically the design of arranging the power supply wirings F_VDD2 on the substrate, based on the arrangement area where the flip-flop circuits FF are arranged. Further, the control unit 11 performs the design of arranging the power supply wirings F_VDD, F_VSS on the substrate and connecting the power supply wirings F_VDD, F_VDD2 to the power supplies VDDp, and performs the design of providing the switch elements to the power supply wirings F_VDD. Then, the control unit 11 goes to the process in step S105.

In step S105, the control unit 11 performs the design of arranging the flip-flop circuits FF along the power supply wirings F_VDD2, and performs the design of arranging the cells other than the flip-flop circuits FF along the power supply wirings F_VDD. Then, the control unit 11 performs the wiring of connecting each cell and the power supply wiring. For example, the control unit 11 performs the design of forming the wiring between the flip-flop circuits FF and the power supply wirings F_VDD2, and performs the design of forming the wiring between the cells other than the flip-flop circuits FF and the power supply wirings F_VDD. Then, the control unit goes to the process of step S106.

In step S106, the control unit 11 performs the delay calculation, and performs the timing adjustment such that the integrated circuit designed by the step S106 satisfies the required timing conditions. Then, the control unit 11 ends this design process. In this way, the design of the integrated circuit is completed.

Summarizing the above, in the integrated circuit design device 200, the control unit 11 calculates the arrangement area where the flip-flop circuits FF are arranged, based on the number of the flip-flop circuits FF and the size of the flip-flop circuits FF to be arranged on the substrate. Then, the control unit 11 performs the design of arranging the power supply wirings F_VDD, F_VDD2 on the substrate and connecting the power supply wirings F_VDD, F_VDD2 to the common power supplies VDDp, based on the arrangement area thus calculated. Here, the control unit 11 performs the design of providing the switch elements to the power supply wirings F_VDD. Then, the control unit 11 performs the design of arranging the flip-flop circuits on the substrate along the power supply wirings F_VDD2. Therefore, the control unit 11 function as the arrangement area calculating unit, the power supply wiring designing unit and the flip-flop circuits arrangement designing unit. Thus, the integrated circuit according to the embodiment is designed.

MODIFIED EXAMPLE

Next, a modified example of the integrated circuit according to the above-described embodiment will be described. As shown in FIGS. 4 to 6, in the integrated circuit according to the embodiment, the power supply wirings F_VDD2 are provided in parallel with the power supply wirings F_VDD. In contrast, in the integrated circuit according to the modified example, the power supply wirings F_VDD2 are provided orthogonally to the power supply wirings F_VDD. It will be specifically described below with reference to FIG. 9.

Figure 9:
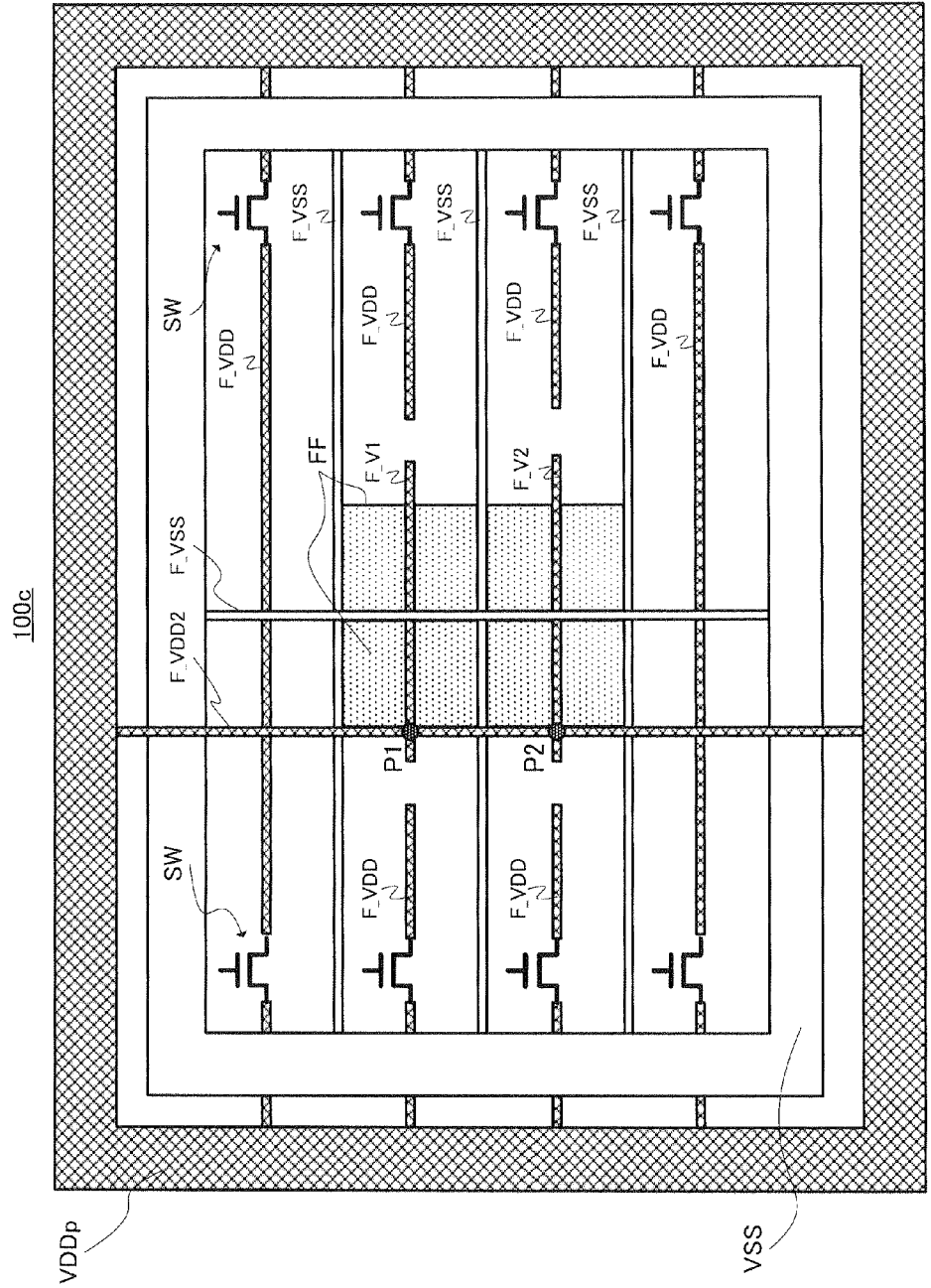
FIG. 9 is a diagram showing an example of a configuration of an integrated circuit according to a modified example.

In the integrated circuit 100c according to the modified example, the power supplies VDDp, VSS are provided in the rectangular shape, and the power supply wirings are provided in a mesh fashion inside the area surrounded by the power supplies VDDp, VSS. Specifically, on the upper layer of the plural power supply wirings provided in parallel with each other, in a manner orthogonal to those plural power supply wirings, other plural power supply wirings are further provided in parallel with each other. FIG. 9 shows an example of the integrated circuit in the case that the power supply wirings are provided in a double-layer structure. In the integrated circuit 100c shown in FIG. 9, the power supply wirings connected to the power supply VDDp are the power supply wirings F_VDD in the lower layer, and the power supply wiring connected to the power supply VDDp is the power supply wiring F_VDD2 in the upper layer. Namely, the power supply wiring F_VDD2 is orthogonal to the power supply wirings F_VDD. Needless to say, while only one power supply wiring F_VDD2 is shown in the upper layer, plural power supply wirings F_VDD2 are actually provided orthogonally to the power supply wirings F_VDD in the lower layer. To each of the power supply wirings F_VDD, the switch elements SW for controlling whether or not the voltage is supplied from the power supply VDDp is provided.

At the intersections P1, P2, the power supply wiring F_VDD2 is in contact with the wirings F_V1, F_V0 which are provided in the lower layer and which are cut from the power supply VDDp at both ends. Therefore, the wirings F_V1, F_V2 also function as the power supply wiring F_VDD2. The flip-flop circuits FF are provided along the wirings F_V1, F_V2 and are connected to the wirings F_V1, F_V2.

The integrated circuit design device 200 can design the integrated circuit 100c according to the modified embodiment by executing the same process as described with the flowchart shown in FIG. 7. However, since the power supply wirings F_VDD2 are orthogonal to the power supply wirings F_VDD, the total length L of the power supply wirings F_VDD2 is calculated by the following equation (2) (see. FIG. 8).

$$L=(N \times Y2)/2 \qquad (2)$$

Similarly to the integrated circuit according to the above-described embodiment, by the integrated circuit 100c according to the modified example, the power supplies are provided in common for the power supply wirings to which the flip-flop circuits are connected and the power supply wirings to which the cells other than the flip-flop circuits are connected. Therefore, by the integrated circuit 100c according to the modified example, the number of power supplies can be reduced, and the increase of the chip size can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions have been described in detail, it should be understood that the various changes, substitutions, and alterations could be made hereto without departing from the spirit and scope of the invention.

The invention claimed is:

1. An integrated circuit, comprising:
a first power supply wiring and a second power supply wiring respectively connected to common power supplies;
a flip-flop circuit connected to the first power supply wiring; and
a switch element which is provided on the second power supply wiring and which switches to determine whether or not to supply voltage from the common power supplies,
wherein at least one of the power supply wirings among a plurality of power supply wirings connecting the common power supplies is cut such that one wiring of the cut power supply wiring is the first power supply wiring and the other wiring of the cut power supply wiring is the second power supply wiring.

2. An integrated circuit design device, comprising:
an arrangement area calculating unit which calculates an arrangement area where flip-flop circuits are arranged, based on a number of the flip-flop circuits to be arranged on a substrate and a size of the flip-flop circuits;
a power supply wiring design unit which performs a design of arranging first power supply wirings to which the flip-flop circuits are connected and second power supply wirings, which are different from the first power supply wirings, on the substrate based on the calculated arrangement area, connecting the first power supply wirings and the second power supply wirings to common power supplies, cutting at least one of the power supply wirings among a plurality of power supply wirings connecting the common power supplies such that one wiring of the cut power supply wiring is the first power supply wiring and the other wiring of the cut power supply wiring is the second power supply wiring, and providing switch elements on the second power supply wirings; and
a flip-flop circuit arrangement design unit which performs a design of arranging the flip-flop circuits on the substrate along the first power supply wirings.

3. An integrated circuit design method executed by a computer, comprising:
an arrangement area calculating process which calculates an arrangement area where flip-flop circuits are arranged, based on a number of the flip-flop circuits to be arranged on a substrate and a size of the flip-flop circuits;
a power supply wiring design process which performs a design of arranging first power supply wirings to which the flip-flop circuits are connected and second power supply wirings, which are different from the first power supply wirings, on the substrate based on the calculated arrangement area, connecting the first power supply wirings and the second power supply wirings to common power supplies, cutting at least one of the power supply wirings among a plural power supply wirings connecting the common power supplies such that one wiring of the cut power supply wiring is the first power supply wiring and the other wiring of the cut power supply wiring is the second power supply wiring, and providing switch elements on the second power supply wirings; and
a flip-flop circuit arrangement design process which performs a design of arranging the flip-flop circuits on the substrate along the first power supply wirings.

\* \* \* \* \*